United States Patent [19]

Palmer

[11] Patent Number: 4,701,999
[45] Date of Patent: Oct. 27, 1987

[54] METHOD OF MAKING SEALED HOUSINGS CONTAINING DELICATE STRUCTURES

[75] Inventor: Clarence K. Palmer, Polo, Ill.

[73] Assignee: PNC, Inc., Polo, Ill.

[21] Appl. No.: 810,032

[22] Filed: Dec. 17, 1985

[51] Int. Cl.$^4$ ............................................. H01L 23/02
[52] U.S. Cl. ................................ 437/211; 174/52 FP;
264/272.17; 264/248; 264/259; 264/274;
357/70
[58] Field of Search .................. 174/52 FP; 357/70;
29/588, 827; 264/272.17, 248, 259, 274

[56] References Cited

U.S. PATENT DOCUMENTS

| 3,714,370 | 1/1973 | Nixen et al. | 174/52 FP X |
| 3,838,094 | 9/1974 | Sporck | 260/37 |
| 4,303,934 | 12/1981 | Stitt | 174/52 FP X |
| 4,305,897 | 12/1981 | Hazama et al. | 264/248 X |
| 4,535,350 | 8/1985 | Goodrich et al. | 357/74 |

FOREIGN PATENT DOCUMENTS 96749  6/1984  Japan ..................................... 29/588

Primary Examiner—Arthur T. Grimley
Assistant Examiner—David A. Tone
Attorney, Agent, or Firm—Leydig, Voit & Mayer, Ltd.

[57] ABSTRACT

A method of making an integrated circuit package comprising an integrated "chip" within an hermetically sealed housing with external electrical leads extending from the chip terminals, and the product formed by such method. The method involves injection molding of a thermoplastic rim on and in sealed relation to a lead frame prior to locating the chip in the central region of the frame and installing fine wire connections from the chip terminals to the lead fingers. The housing is completed by a solid bottom wall insert sealed in the lower mouth of the rim and a solid top wall cap sealed to the upper mouth of the rim by procedures which involve no flowing of plastic material over or into contact with either (i) the upper surfaces of the lead fingers prior to making the wire connections to such fingers, or (ii) the chip and the wire connectors after they have been associated with the lead frame.

15 Claims, 15 Drawing Figures

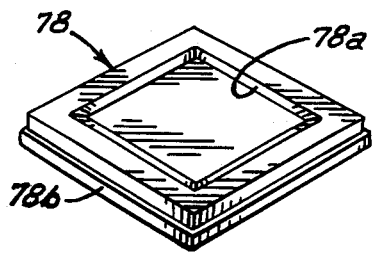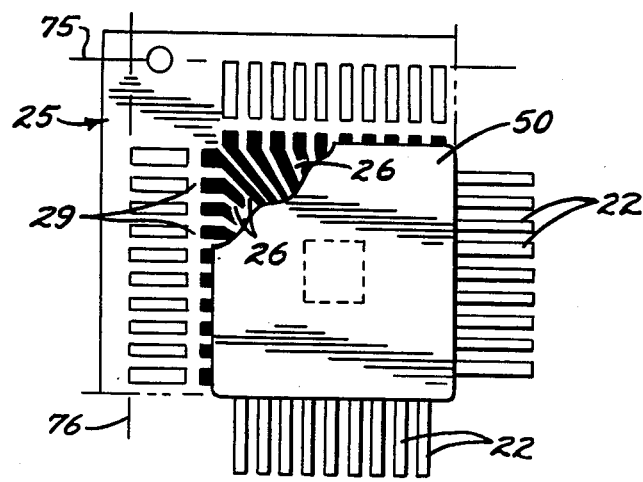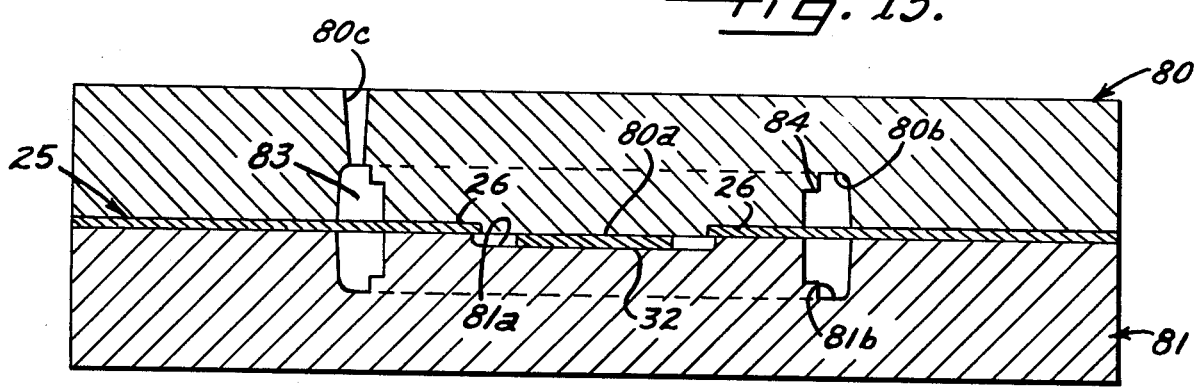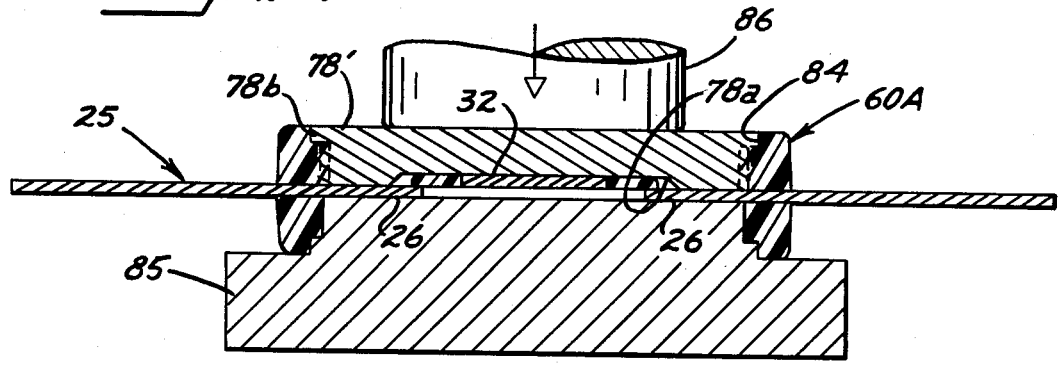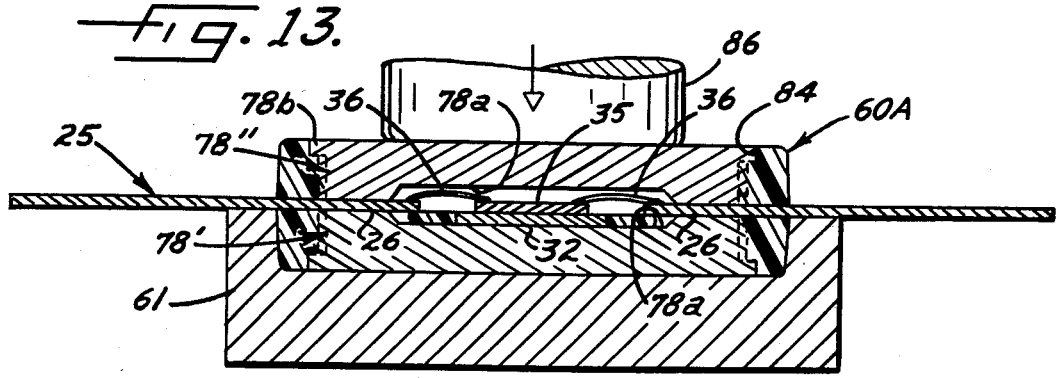

METHOD OF MAKING SEALED HOUSINGS CONTAINING DELICATE STRUCTURES

BACKGROUND OF THE INVENTION

The present invention relates to methods of making articles which are constituted by delicate structures contained within sealed housings, and to products so constituted. More particularly, the invention pertains to methods of making integrated circuit chip assemblies ("packages") each constituted by an integrated chip within a sealed housing formed partly of injection molded plastic, with leads extending in sealed relation through the housing for electrical connections, and to the products so constituted. Since the invention is likely to find its most advantageous usage in the manufacture of integrated circuit chip assemblies, the latter will be referred to in the following disclosure as a specific example of the generic applications of the invention. For generic breadth, limited reference will be made to "delicate structures" of the sort typified by integrated circuit chips and fine connecting wires.

As the solid state electronics industry has progressed during the last several years, the numerical volume of integrated circuit chip assemblies manufactured and sold each month has risen astronomically. The "scale of integration" (in terms of the number of equivalent circuit elements on one chip) has increased in like fashion. There are literally millions of integrated chip assemblies now being manufactured each month, and while some may be quite simple (e.g., "quad flipflops"), others are very extensive and/or expensive (e.g., 32-bit microprocessors or one megabit memories) in terms of the complexity and equivalent number of individual circuit elements on a single chip. As the chips per se are being manufactured and tested, there are necessarily some which are found to be defective and thus rejected; "yield" is significantly less than one hundred percent. The second major stage of manufacture involves "packaging" each chip in a sealed housing with electrical leads extending therefrom.

It will be useful to define and distinguish between two broad classes of integrated chip packages, i.e., those commonly called "commercial grade" and "MIL SPEC", respectively. The "commercial grade" assemblies most usually include hermetically sealed housings constituted in whole or in part by molded plastic materials, whereas MIL SPEC assemblies most usually include hermetically sealed housings constituted by ceramic material walls joined by fused glass frit seals fired (melted) at very high temperatures. The MIL SPEC assemblies have much higher immunization to environmental extremes of moisture, temperatures, pressure and vibration which may be encountered in military or outer space applications. The "commercial grade" products are neither constructed nor rated to stand up under such extremes, but must be and are capable of preserving the interior chip under the less severe environmental conditions encountered in industrial, commercial, and domestic consumer uses. MIL SPEC grade chip assemblies are much more expensive—in terms of cost for both the housing materials and the manufacturing procedures—, and they are manufactured in much lesser quantities compared to the "commercial grade". For purposes of the present patent application, however, the two classes of products will be called Type I (exemplified by the "commercial grade") to designate that at least some portion of the sealed housing is constituted by injection molded plastic material, and Type II (exemplified by "MIL SPEC grade") to designate that no portion of the sealed housing is formed of injection molded plastic. These definitions are to be taken without regard to ratings or capabilities for survival in military or outer space applications (on the one hand) or only industrial/commercial applications (on the other hand).

Type I integrated circuit assemblies or packages are truly "mass produced" in view of the market demand and the quantities turned out each month. The process of "packaging" chip assemblies of Type I must be carried out on every product and thus is practiced literally millions of times. This second stage operation also results (for reasons explained below) in some of such final products being defective and thus rejected; "yield" from the second stage of Type I assembly manufacturing is significantly less than one hundred percent and is estimated to be on the order of ninety to ninety-five percent.

A defective packaged assembly almost always means discarding a previously tested "good" integrated chip at the most costly stage. Thus, rejects arising during and because of the packaging operation constitute a severe burden on the cost and efficiency of manufacturing integrated circuit assemblies. The problem is all the more severe when packaging operations result in scrapping of relatively expensive and "large scale" integrated chips (e.g., 32-bit microprocessors).

SUMMARY OF THE INVENTION

It is the general aim of the invention to bring forth a method of manufacturing Type I integrated chip assemblies (i.e., chips in sealed housings with external leads) which will alleviate, and essentially eliminate, spoilage and rejects resulting from the formation of the sealed housing—and at added packaging costs of such small degree that net savings to the industry will be highly significant.

A corollary objective of the invention is to provide a method of manufacturing Type I integrated circuit chip assemblies characterized by the absence or minimization of damage to the chip, and its associated fine wire connections to a lead frame, as a result of (i) physical flowage of plastic material, or (ii) thermal shock resulting from contact with or proximity to hot plastic material, during the course of plastic injection molding operations.

A related object of the invention is to provide a method of packaging integrated circuit chips in Type I sealed housings which facilitates the installation of the chips per se and the wire connections from chip terminals to conductive fingers of a lead frame.

Still another object is to provide such a method wherein the chip and lead frame fingertips are firmly supported and fixed in position by a partially formed housing at the time fine wire conductors (or the like) are welded or otherwise connected between the chip terminals and the lead tips.

In a more specific aspect, it is an object to provide such a method which results in seals of relatively high structural and hermetic integrity between the separate components of a housing which is not truly a single homogeneous body.

Further advantages and objectives of the invention reside in such a method which leaves the chip and its fine wire connectors free of contact with the housing.

Another objective of the invention is to provide a product or article of manufacture—constituting a Type I integrated circuit chip assembly including a sealed housing—which is lower in overall production costs by virtue of increased yields and which may have the advantageous characteristics described in the preceding paragraph, compared to products of that general nature presently known or available in the marketplace.

The objects of the invention have been set forth above with specific reference to methods for making, and products constituting, integrated circuit chip assemblies. This has been done for purposes of clarity and because the invention will find immediate usage with regard to such assemblies. But in a generic sense, an integrated circuit chip (viewed optionally as including its fine wire connectors) may be viewed as a delicate structure subject to physical damage by rubbing contact, subject to damage by thermal shock or unduly elevated temperatures, in the course of creating a sealed housing to surround it. Thus, all of the foregoing objects and advantages of the invention in its broader aspect should be understood as applying generically to methods and apparatus for packaging any delicate structure within a sealed housing in association with one or more connection sheets (exemplified by a lead frame) which project through the housing.

Other objects and advantages will become apparent as the following description proceeds in conjunction with the accompanying drawings.

BRIEF DESCRIPTION OF THE DRAWING

FIG. 11 is a perspective view of a pre-formed wall member which is made and utilized as both a bottom wall insert and a top wall cap according to a second embodiment of the invention;

FIG. 12 is a cross section of mold dies, and components located therein, illustrating an injection molding operation performed during and as one step in the second embodiment of the method;

FIG. 13 is a cross section of the produce (shown up-side-down) after completion of the molding operation illustrated in FIG. 12, and further illustrates apparatus for installing and sealing a bottom wall insert;

FIG. 14 is a cross section of the product after the operation illustrated in FIG. 13 has been completed and shows the next step of installing and sealing a top wall cap; and FIG. 15 is a plan view (partially broken away) of the product as it exists in either FIG. 10 or after the operation illustrated in FIG. 14.

DETAILED DESCRIPTION OF THE PREFERRED EMBODIMENTS

While the invention has been shown and will be described in specific details with reference to embodiments which are to be taken only as examples, there is no intention thus to limit the invention to such details. On the contrary, it is intended here to cover all modifications, alternatives and equivalents which fall within the spirit and scope of the invention as defined in the appended claims.

Figure 1:
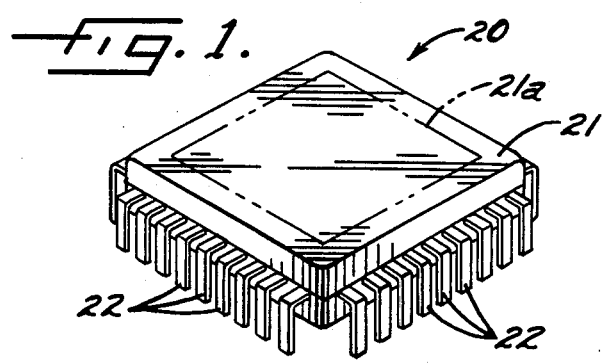
FIG. 1 is a perspective view of a typical, fully completed integrated circuit chip assembly constituting a preferred product embodiment of, and made according to a preferred embodiment of the method of, the present invention.

FIG. 1 illustrates a fully completed IC package or assembly 20 which appears externally just as if it were one of many commercial grade chip assemblies made and used in the prior art. In its essential aspects, the assembly 20 comprises a sealed housing 21 and a plurality of externally projecting, downwardly turned leads 22 which provide external connections to an internally-contained IC chip (not visible). The leads 22 may, for example, plug into an appropriate chip socket or may fit through a corresponding pattern of holes in a printed circuit board to receive soldered connections, or may otherwise be electrically connected by what is called the "surface mount" technique. The shape of the package 20 as viewed from above is entirely a matter of choice; it may be rectangular, round or otherwise—and it is here shown as square. Although perhaps not actually visible from the exterior, a junction represented in phantom at 21a exists in the material of the housing 21 as a result of forming a fusion seal to a cap (as hereinafter described).

In the manufacture of IC packages, a "lead frame" is initially made of conductive material such as copper or a copper alloy. It is a planar sheet of a desired shape with material removed (e.g., by stamping) to create a desired pattern of voids which leave defined a plurality of lead fingers structurally connected until the package is completed to support them, after which the edges of the frame are trimmed. The thickness of the lead frame sheet is a matter of design choice dictated by a given specific application; the sheet is, however, relatively thin and in many cases the sheet is in thickness only about 10 mils or less, thus being flexibly deformable and highly fragile.

Figure 2:
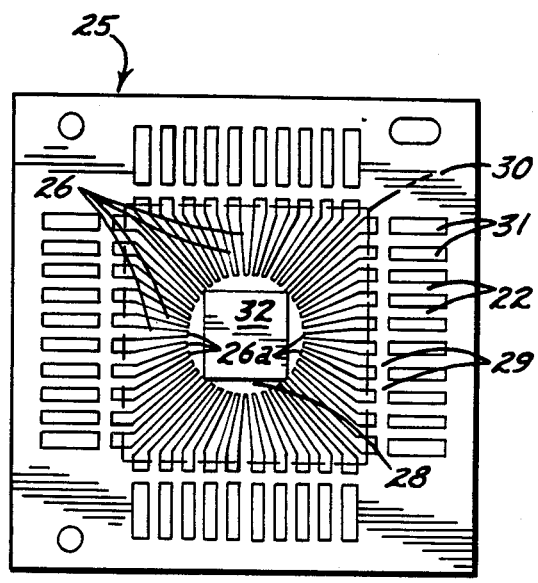
FIG. 2 is a plan view of a typical lead frame and one which, for purposes of discussion by way of example, is included as a component within the assembly.

A typical lead frame 25 is shown in FIG. 2 as a planar, rectangular sheet of copper alloy material which is approximately 10 mils thick. As may be seen, the lead frame includes a plurality of lead fingers 26 extending inwardly with their tips 26a disposed in proximity to a central region 28. The fingers are separated from one another but structurally connected and supported by bridges 29 outside of a peripherally closed "sight" 30 along which a housing will later be formed. Each lead finger 26 extends from within the sight outwardly such that one of the leads 22 is a continuation or extension of that lead finger, the leads being separated by gaps 31. As an optional part not included in some lead frames, the lead frame sheet shown in FIG. 2 includes a die pad 32 disposed in the central region 28 and carried at its corners by four tie bars which are similar to dedicated lead fingers. These tie bars can be bent downwardly so that the pad is depressed below the main plane of the sheet (see FIG. 3). Again, the configuration of the lead frame may take on any of diverse shapes and patterns and may create any desired number (say, from 8 to 124) lead fingers whose tips border a central region. When a large scale integrated chip is to be accommodated, and the number of required lead fingers is high, each finger and each separating space between fingers becomes very narrow. Thus, the fingers are extremely delicate; they are flexible and easily deformed into undesired touching engagement.

Figure 3:
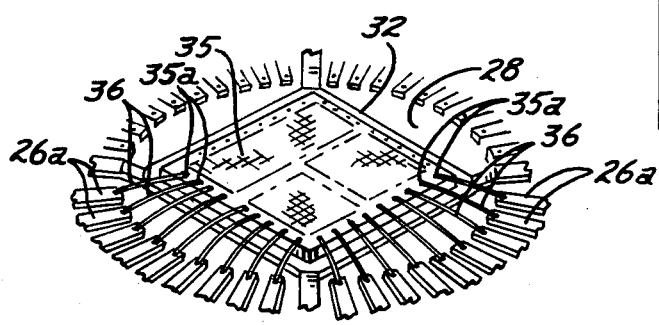
FIG. 3 is an enlarged view of the central region of the lead frame after an integrated circuit chip (herein sometimes referred to by the abbreviation IC chip) has been associated therewith and wire connectors installed.

In one common and widely used prior packaging procedure, an IC chip is installed on or associated with the lead frame before the housing is created. The lead frame is placed in a suitable platen or support (not shown), and the chip 35 is fixed (by epoxy glue or the like) on the die pad 32, as illustrated in FIG. 3. Then, wire connections are made (by thermosonic or thermocompression bonding) of very fine (e.g., 0.001" diameter) wires 36 from terminals 35a on the chip to respective ones of the lead tips 26a. To assure successful connections without deforming or shorting the lead fingers, an underlying support (e.g., a platen, not shown, recessed to receive the die pad and to support the lead fingers) is usually employed.

Figure 4:
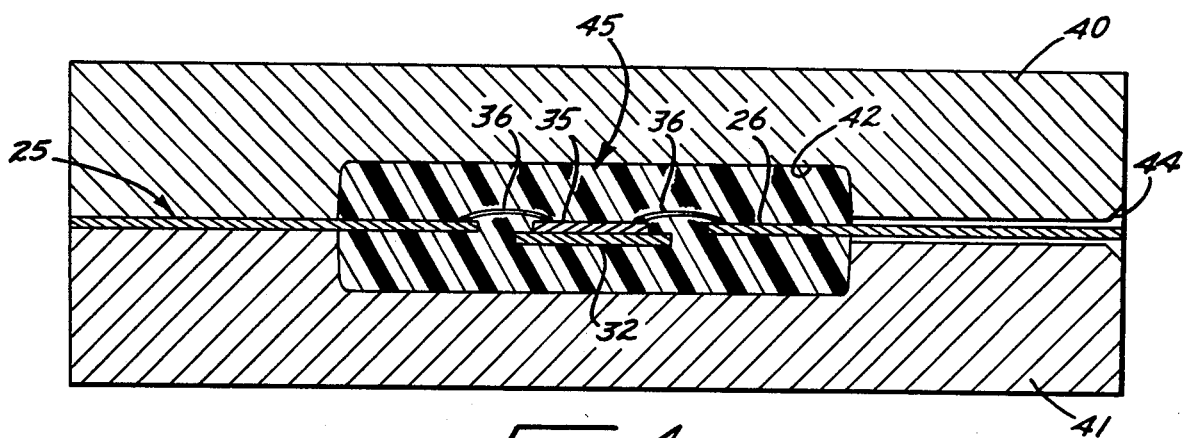
FIG. 4 is a cross section of mold dies and a mold cavity, revealing the formation of an IC chip assembly according to known prior art.

Once the chip 35 and the wires 36 are in place, as shown in FIG. 3, a sealed housing is created with its periphery essentially conforming to the lead frame "sight" to contain the chip and to leave the leads 22 extending externally from the lead fingers 26. The next step in the prior art packaging procedure is illustrated in FIG. 4 and involves disposing the lead frame between two dies 40, 41 which define a mold cavity 42 bounding the "sight" 30, followed by injection of a thermosetting plastic material in a flowable state. An epoxy uncured and flowable at a temperature of about 175° C. is injected via a gate 44 (here shown lying on the parting plane) to fill the cavity, thus totally encapsulating the chip 35, wires 36 and lead fingers 26 in what constitutes a sealed plastic housing 45. Typically, total curing or polymerization of the flowable, thermosetting plastic material requires a five minute dwell in the heated mold, followed by eight hours of post mold curing at 150° C.

Once the housing 45 is completed, the peripheral edges of the lead frame 25 and the bridges 29 are trimmed away to leave simply the externally projecting leads 22 which are then bent downwardly to take on the configuration shown in FIG. 1.

This prior packaging procedure is successfully employed in industry to manufacture IC assemblies— but with severe drawbacks which increase the per unit production costs when it is considered that a given factory may turn out a million units per month. The chips themselves (previously tested to confirm operability) represent in some instances the most expensive components, and spoiling of chips during the packaging operations thus greatly increases the per unit cost of the final, good assemblies. Yet, the prior packaging method inevitably leads to a significant number of finally rejected products. It is believed that damage during the packaging process occurs for any or a combination of reasons. The injection of flowable plastic at high temperatures (e.g., 175° C. or greater) as described with reference to FIG. 4 involves physical flowage of that material over the chip 35, the fragile wires 36, and the welds or connections at the ends of those wires. Thus, damage in the nature of bond wires contacting themselves, wire sweep (sometimes called "lead wash") can and does occur, and the breaking or shorting of only one connection will result in a rejected unit. Secondly, the inflowing plastic at elevated temperatures can in some cases create thermal shock of the chip, the wires, and their connections, this leading to breakage of the wire connections due to sudden differential expansion. The prior art method and its package are indeed employed commercially, but yields from the packaging operations are far below (estimated at about ninety to ninety-five percent) those which are desired and sought by industry. This becomes especially crucial for the more recent large and complex chips (e.g., 32-bit microprocessors) where the manufacturing cost of the chip per se is relatively very high (e.g., fifty dollars) and the loss of assemblies because of damage during the packaging operation significantly drives up the total unit cost of the assemblies which survive.

The method of the present invention alleviates or eliminates the factors discussed above which decrease yields from the packaging of commercial grade integrated circuit chips (or similar delicate structures). The present method will be described with reference to individual steps which are involved, but except as specifically noted, the sequence of those steps is not critical. When completed, the sealed housing according to the present invention (and containing the IC chip with external leads) will be in the nature of a box having a bottom wall, vertical side walls defining a closed periphery, and a top wall—the housing being created according to the method now to be described. It should be understood, however, that references to "top", "bottom", "upper", "lower" and "side" are made merely for clarity with reference to the drawings, and these terms are non-limiting. One can always re-orient the object being discussed so as to change the direction or the sense which those terms denote.

Preforming A Solid Bottom Wall Insert

As a first step, a bottom wall insert 48 (shown upside-down in FIG. 5) is preformed of any suitable material. It is a relatively thin disk or plug having a peripheral shape generally corresponding to the chosen shape for the finished product and the "sight" 30 of the lead frame 25. The material from which the insert 48 is made (for example by molding or stamping) is relatively unimportant but there are factors which dictate preferences. Preferably, and for reasons to be explained, the bottom wall insert 48 is manufactured by an injection molding operation such that at least its edge portions are constituted of a solidified thermoplastic material, or such that it is, quite simply, made entirely of that material. The insert 48 is sized and shaped to mate with the lower mouth of the rim later to be described. Optionally, the edges of the insert 48 are configured to define ridges, grooves or teeth which lengthen and enhance the integrity of a seal created between those edges and that rim.

Figure 5:
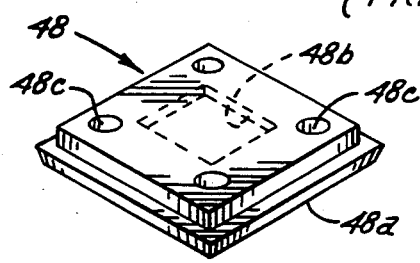
FIG. 5 is a perspective view of a solid bottom wall insert (shown in an up-side-down position) made and used in the practice of the invention.
Figure 7:
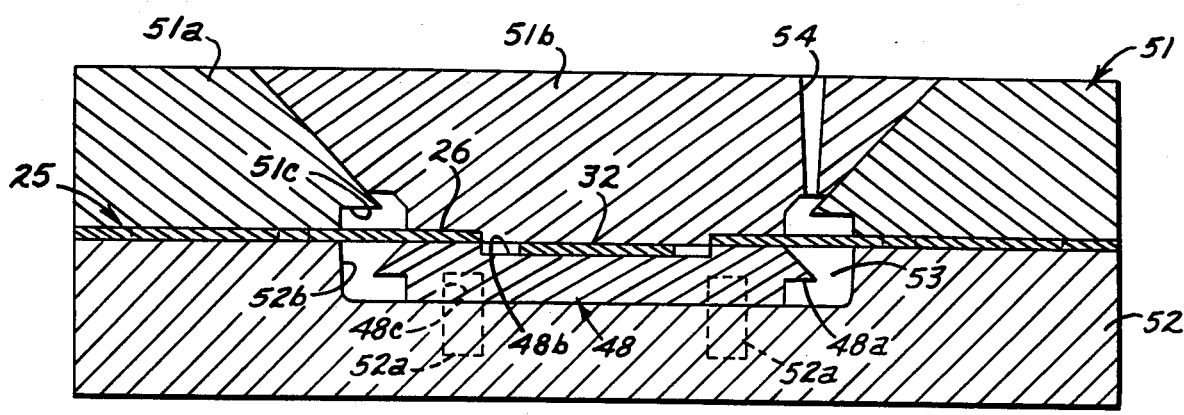
FIG. 7 is a cross section of mold dies, and components located therein, as employed in a plastic injection molding operation which constitutes one step in the preferred embodiment of the method.
Figure 8:
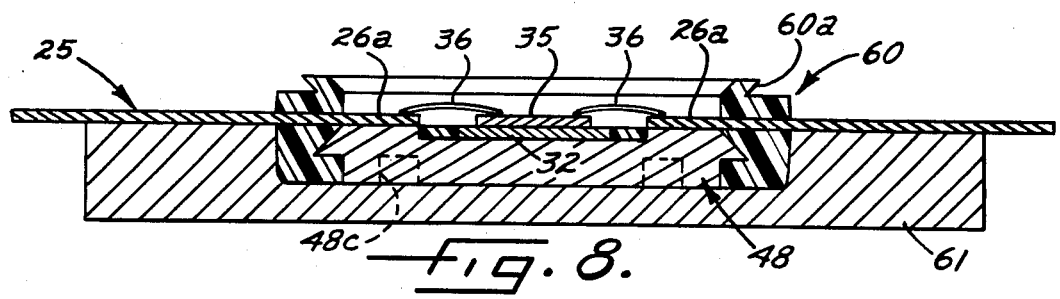
FIG. 8 is a cross section of the structure resulting from the molding operation of FIG. 7 and illustrates a succeeding step in the practice of the invention.

In the presently illustrated form, the insert 48 of FIG. 5 is made as a relatively thin and flat object molded entirely of thermoplastic material with an edge sloping downwardly from its upper surface and then turned inwardly to define a tooth 48a (see the insert 48 in cross section in FIG. 7). Also, as an optional detail, the upper surface of the insert 48 is formed with a central recess 48b to receive the depressed pad 32 of the lead frame when the lead fingers 26 are abutted on their undersides by the upper surface of the insert. This recess 48b is represented by phantom lines in FIG. 5 but appears more clearly in the cross sectional view of FIG. 7. Finally, the bottom surface of the insert 48 is formed with holes 48c adapted to receive locator pins as subsequently described.

Preforming A Solid Top Wall Cap

As a second step, a top wall cap 50 is preformed of any suitable material. Preferably, and for reasons to be explained, it is created by injection molding such that at least its edge portions are constituted of a solidified thermoplastic material. Indeed, the entire cap may conveniently be made as a molded object constituted (as here shown) entirely of such material. The top wall cap 50 is made in size and shape to generally mate with the upper mouth of a rim later to be described, and may optionally have edge surfaces lengthened by grooves and ridges to enhance the integrity of a seal to be created between the cap edges and such rim.

Figure 6:
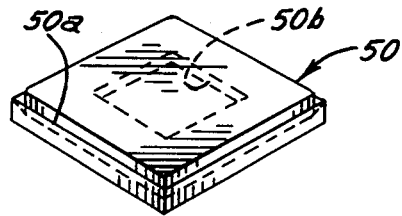
FIG. 6 is a perspective view of a solid top wall cap made and used in the practice of the invention.

In the presently preferred embodiment, the cap 50 (FIG. 6) is simply a square or rectangular wafer of molded thermoplastic material shaped to define an angled tooth 50a (visible best in the cross section of FIG. 9) at its edges and a relief or recess 50b in the middle region of its underside.

Injection Molding A Plastic Rim On The Lead Frame

With the insert 48 and the cap 50 available, the method of the present invention is carried out by the step of associating the lead frame 25 (FIG. 2) with a mold cavity while injecting a plastic material in flowable state, and causing such material to solidify, thereby to form a rim which captures and seals to the lead frame in the vertical mid region of the rim, i.e., between the upper and lower ends of the rim.

In the preferred embodiment illustrated in FIGS. 7-10, this step is effected simultaneously with another step of creating an hermetic seal between the edges of the bottom insert 48 (although these steps may be executed separately in time as hereinafter explained). Specifically, upper and lower dies 51 and 52 are provided in the configuration shown by the cross sectional view in FIG. 7. The lower die has a rectangular pocket 52b with four pins 52a extending upwardly from its floor and spaced to register with the holes 48c (FIG. 5) of the insert 48. The insert 48 is placed down into the pocket 52b and retained against shifting by the pins 52a being received in the mating holes 48a. The die pocket 52b is in depth equal to the thickness of the insert 48 so that the upper surfaces of the die and insert lie essentially in a common horizontal plane. The pocket 52b is, moreover, essentially the same shape (square or rectangular when viewed from above) as the insert 48 but larger in size so as to leave, in effect, a "moat" between the insert and the body of the die 52.

The lead frame 25 is laid on the lower die 52 so that the sight 30 registers with the "moat", and with the platform 32 resting on the floor of and centrally disposed in the insert recess 48b.

The upper die 51 is then brought down into "closing" relation with the lower die. As shown in FIG. 7, the upper die is made in separable parts 51a, 51b which collectively create a pocket 51c in the underside, such pocket being sized and shaped to overlie the "moat" of the lower die. Four of the parts 51a (only two being visible in FIG. 7) form the rectangular order of the upper die 51, with the central part 51b having inclined surfaces which mate to the border parts 51a. In its central portion, the upper die has a square boss that closes down intimately against the platform 32 and just snugly projects downwardly along the inner ends of the lead finger tips 26. Bordering the boss is a flat foot surface which fits snugly against the upper surface of the lead fingers 26. Outwardly from that foot surface is the pocket 51c formed and bordered partly by each of the two die parts 51a, 51b. The latter is shaped to define an upwardly and outwardly angled "tooth" within the pocket.

With the two dies 51, 52 closed and thus containing the insert 48 and the lead frame 25 as shown in FIG. 7, the lead frame is thus associated with a mold cavity 53 which spans across the lead frame in a vertical direction, there being communication through the interstices between the spaced lead fingers from the upper to the lower portions of the mold cavity. Now, plastic material in a flowable state is injected under pressure into the cavity 53 via a passage or gate 54, thereby to form a vertically upstanding rim 60 (best seen in FIG. 8 after it has been formed). The plastic material may be chosen as any which is susceptible of successful injection molding and suited to the desired characteristics of the end product. It may be either a polymerizable epoxy, a thermosetting plastic or epoxy, or a thermoplastic. If the latter is chosen, the material marketed by Phillips Petroleum Co. under the designation RYTON R-7 (trademark) is presently preferred, for example. The injection machine and the injection molding procedure are conventional and familiar to those skilled in the art, so that details beyond FIG. 7 need not be described. If thermoplastic RYTON is the chosen material, it is injected in a flowable state at an elevated temperature of about 650° F. and a screw pressure of about 8000 psi to fill the cavity 53. During the injection, this material completely fills the mold cavity 53 and flows through and into the interstices between the spaced lead fingers and into the space between the lead fingers and the central platform 32. The material is caused to solidify by permitting it to cool for approximately fifteen seconds, after which the mold is opened by lifting the central die part 51b and then separating at an upward angle the four separable die parts 51a. If a thermosetting material is employed, then the mold will itself be heated and kept closed for about five minutes to cause partial curing and solidification of the plastic, greatly increasing process time required.

Once the mold dies in FIG. 7 have been opened, the lead frame 25 and the rim 60 existing thereon may be lifted out. A cross section illustration of them appears in FIG. 8 where they are shown as having been placed in a recessed platen 61 simply as a convenient support. It will be seen that the injection molding step of FIG. 7 results in the rim 60, at its mid-region intermediate its upper and lower ends, capturing and bonding, with hermetic sealing, to the lead frame along the chosen sight 30 (FIG. 2). The plastic material has also flowed into and solidified within the spaces between the several lead fingers 26 (this being visible in FIG. 15) and the space between the platform and the finger tips. The upper surfaces of the platform 32 and the lead fingers 26 remain clean and free of plastic material, however, because the upper die has mated intimately with those surfaces during the injection of FIG. 7. Thus, the step of injecting plastic into the mold cavity 53 (FIG. 7) results in creating the upstanding four side walls of a rectangular or square "box" with a bottom wall constituted by the insert 48, the side walls capturing and sealing to the lead frame.

Locating The Insert In The Rim And Sealing The Two

In the preferred embodiment of FIGS. 7-10, a secondary but important result comes directly from the procedure of molding the rim 60. Since the preformed bottom wall insert 48 as placed in the pocket 52b of the lower die (FIG. 7), the injected plastic flows into intimate contact with the edges of the insert 48 and thereby an hermetic seal is created between the two. Thus, the steps of (i) forming the rim 60, and (ii) creating an hermetic seal between the edges of the insert 48 and the rim 60, are accomplished concurrently. The bonding of the rim 60 to the insert edges may be sufficient in itself to create the desired hermetic seal even in cases where the insert is made of other material such as glass or metal with an insulating layer on its upper surface. If, as preferred, the edge portions (or the entirety) of the preformed insert 48 are of a thermoplastic material, however, then the heat of the injected material which forms the rim will, to some extent, melt those edges and the joinder will be a high integrity seal formed by fusion. The boundary between the insert edges and the rim 60 is shown well defined in FIG. 8 for purposes of better understanding, but when the preferred thermoplastic materials are employed, the rim and the insert edges will to some degree melt and run together. In such case, the boundary will not be so well defined and the "box" with an open upper end (as viewed in FIG. 8) will at least approximate an integral homogeneous cup constituted by the bottom wall insert and the vertically upstanding rim 60.

The tooth 48a on the insert 48 aids in creating this fusion seal; but even if fusion is not involved, that tooth results in a longer and tortuous junction which adds to the integrity of the seal.

Although it is optional, the upper end of the rim 60 includes an upwardly and outwardly angled tooth 60a which serves a purpose described below.

Installing The Chip and The Wire Connectors

After the rim-molding operation has been completed by the injection molding described with reference to FIG. 7, the IC chip 35 and the fine wire connectors 36 are installed in association with the lead frame. When the rim-molding procedure has been executed, the platform 29 and the lead fingers 26 are firmly supported and backed-up on their undersides by the bottom wall insert 48, and they are restrained against lateral shifting by the solid plastic material which fills the interstices between them (see FIG. 15). Their upper surfaces are, nevertheless, clean and readily accessible through the open mouth of the rim. Thus, the partially finished product may be conveniently supported in the platen 61, and a human operator may simply apply a suitable epoxy or other adhesive to the platform 32 and lay the chip 35 in place as it appears in FIG. 8. The adhesive is preferably chosen to have good thermal conductivity and good temperature stability. Next, the several wires 36 are connected by bonding between the terminals on the chip 35 and the respective lead tips 26a. When such connections of the wires are being made, pressure may be applied to the lead tips and to the chip without worry that they or the platform will be bent, distorted or shorted together—a concern which would exist absent the back-up by the insert 48, in view of the fact that the lead frame and its fingers may be on the order or 0.010" thick and thus very flexible.

Locating The Top Cap In The Rim Mouth

In the method embodiment of FIGS. 7-10, the next step is to locate the top wall cap 50 above the chip 35 and the lead wires 36, followed by the step of creating a tight seal between the edges of the cap and the upper end portions of the rim 60.

Figure 9:
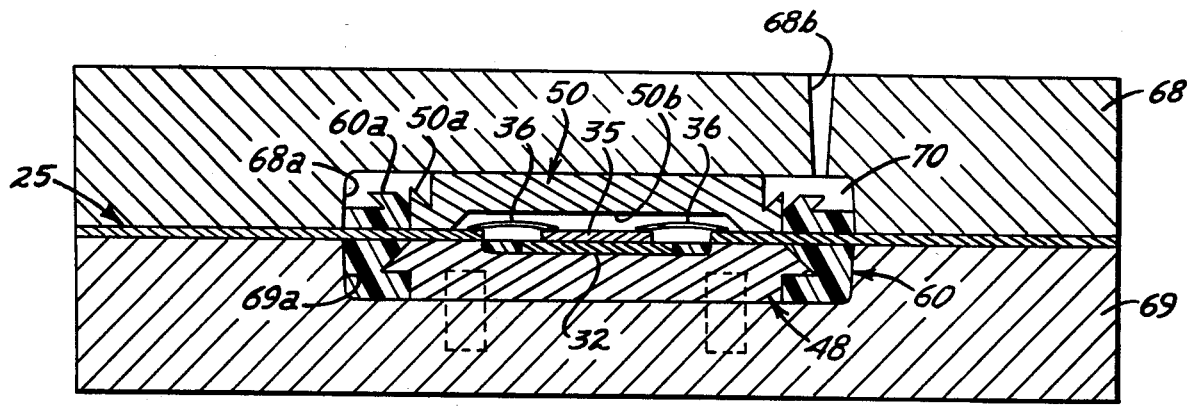
FIG. 9 is a cross section of mold dies, and components located therein, as employed in a second injection molding operation carried out according to the preferred embodiment.

As specifically shown in FIG. 9, the cap 50 is first fitted—somewhat like insertion of a plug—into the upper mouth of the rim 60, resulting in the upper edge portions of the cap being in physical proximity to or general registry with the upper end of the rim. The teeth 50a, 60a are thus disposed generally adjacent to one another. The recess 50b in the underside of the cap leaves some clearance space, i.e., leaves the cap free of contact with both the chip 35 and the wires 36. Preferably and as shown in FIG. 9, the cap 50 at its outer bottom surfaces firmly abuts against the lead frame just inside the rim 60.

Making A Seal Between The Rim and The Cap

Once the cap 50 is in place (as shown in FIG. 9), the assembly is disposed in a second mold cavity formed by upper and lower dies 68, 69 brought into closing relation as illustrated in FIG. 9. The lower portion of the rim 60 and the insert 48 extend downwardly into a mating pocket 69a of the lower die; the lead frame 25 thus rests on the flat, upper surface of that die 69. The upper die 68 is shaped to define a rectangular pocket 68a whose surface bears on the top of the cap 50. The lower surface of the die 68 outboard from the pocket 68a closes down against the upper surface of the lead frame 25. The two dies 68, 69 thus form a mold cavity 70 which spans the edges of the cap 50 and the rim 60. Any suitable plastic material in flowable state is then injected to fill that cavity via a gate passage 68b, conventional injection molding apparatus and techniques being employed. The plastic material may be an epoxy, a thermosetting plastic, or a thermoplastic—the essential charasteristic being only that it form, when it is caused to harden, a good hermetic seal between the cap 50 and the rim 60. Preferably, the material injected into the cavity 70 is similar or identical to the RYTON material identified above, and preferably at least the edges of the cap 50 were made of the same thermoplastic material. The injection molding, if RYTON is employed, is carried out with the thermoplastic material at about 650° F. and at about 8000 psi screw pressure.

After the flowable plastic has been injected into the cavity 70, it is caused to solidify by curing in the case of thermosetting material or simply by cooling for about two minutes in the case of thermoplastic material. In consequence, a solid bridge 71 (best seen in FIG. 10) is formed with hermetically sealed contact to both the edges of the cap 50 and the upper edge portions of the rim 60. The mold dies 68, 69 may now be opened, and the assembly with a fully sealed housing (in the state shown by FIG. 10) lifted from the mold die 69. The bridge 71 constitutes a part of the completed, box-like, fully sealed housing.

The material which is injected to form the bridge 71 may serve by itself to create the necessary sealing contact to the cap edges and the upper edges of the rim in those cases where the rim is initially created from a thermosetting material and/or the cap 50 and its edges are created from any material other than a thermoplastic (e.g., from metal or glass or thermosetting plastic). When the rim is thermoplastic, however, and at least the edge portions of the cap 50 are thermoplastic, the injection of an identical or similar thermoplastic material at elevated temperatures to create the bridge 71 results in at least some melting and fusing of the cap and rim. This creates a very reliable and somewhat homogeneous seal structure because fusion occurs to some degree and tends to make the cap edges, the bridge 71 and the rim a more or less integral piece. The boundaries between the three parts (rim, cap and bridge) are not well defined (as shown in FIG. 10 for clarity) and the seal which is created between the rim and the cap is both structurally and hermetically strong.

The teeth 50a and 60a, in any event, make the seal boundary longer and tortuous, so that the hermetic integrity of the seal is enhanced and the small chances of dislodgment of the bridge and cap are even less. As indicated, however, the teeth or ridges or grooves are optional and may not be required in many commercial cases.

Figure 10:
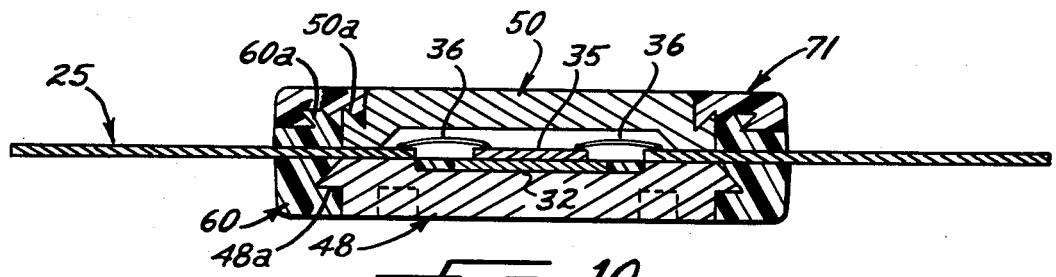
FIG. 10 is a cross section of the product as it exists after the molding operation of FIG. 9.

The product in the stage shown by FIG. 10 appears in the plan view of FIG. 15 where a part of the bridge, cap and rim are broken away to reveal the lead fingers 26 inside the plastic housing. It may be seen that the injection molding step described with reference to FIG. 7 has resulted in thin webs of solid plastic material filling the interstices between adjacent lead fingers, but (as made clear by FIG. 10) not having flowed around or over the delicate structure constituted by the chip 35 and the wires 36. Indeed, the chip 35 and the wires 36 had not yet been installed at the time the rim was molded (FIG. 7) and the lead finger interstices were filled with plastic.

From the condition shown in FIG. 15, the product is completed by trimming (in a die press or the like) portions of the exteriorly exposed lead frame 25. Specifically, the marginal portions of the lead frame are trimmed away along lines 75, 76. The bridges 29 and the adjacent thin webs of plastic (exterior of the housing) are also trimmed away. This leaves only the leads 22 (see the right and lower portions of FIG. 15 where the trimming has been completed) which are continuations of the respective lead fingers 26. These leads 22 are then bent downwardly to the configuration appearing in FIG. 1. The final product is thus a fully sealed assembly 20 (FIG. 1) comprising a sealed housing 21 containing an IC chip with external leads 22 for making connections to the chip when installed later on a printed circuit board or the like. That final product has been manufactured without subjecting the delicate structure constituted by the chip 35 and the wires 36 to any physical flowage of hot plastic material, and without subjecting them to thermal shock.

A SECOND EMBODIMENT

A second embodiment of the method and the product of the method will now be treated with reference to FIGS. 11-14. This includes preforming two essentially identical wafer-like pieces, such as the wafer 78 in FIG. 11, and which will serve as a bottom wall insert 78' and a top wall cap 78" appearing in FIG. 14. In peripheral shape, the wafers are made to more or less mate with the upper and lower edges of a rim earlier or later formed by injection molding. They are made with a centrally-located recess 78a in one flat surface and a peripheral flange 78b extending outwardly at the edges. These wafers may be made of any suitable material (such as thermosetting plastic or even metal or glass), but preferably they are fabricated (by injection molding) such that at least their edge portions are of a solidified thermoplastic material typified by the RYTON thermoplastic identified above.

As the next step, the lead frame 25 is associated with a mold cavity which defines an upstanding rim on the sight 30 surrounding the inner ends of the lead fingers 26; plastic material in flowable state is injected; and the material is caused to harden so as to form a rim which captures the lead frame with intimate sealing contact. Upper and lower dies 80, 81 are closed together to grip the lead frame between them (FIG. 12). The lower die is shaped to define a central recess 81a into which the lead frame pad 32 fits, and to define a rectangular groove 81b beneath the lead frame sight 30. The upper die is shaped to define a central boss 80a which grips down upon the upper surface of the platform 32 and extends vertically downward past the ends of the lead finger tips. This upper die also has a rectangular groove 80b located above the lead frame sight. The two grooves 81b, 80b collectively define a rim mold cavity 83 extending above and below the lead frame with communication through the spaces between adjacent lead fingers.

With the dies closed as shown in FIG. 12, plastic material in flowable state is injected via a gate 80c into the mold cavity 83 by conventional injection molding procedures. The plastic material flows into and fills the entire mold cavity as well as the interstices between the individual lead fingers and the small spaces between the platform 32 and the lead fingers. By virtue of the shape of the upper die, the plastic material cannot reach the upper surfaces of the lead fingers and the platform; these surfaces remain clean and undamaged. The plastic material is caused to solidify (by curing or cooling, for example) and thereby creates a solid rim 60A (as it appears in FIG. 13). The dies may then be opened and the lead frame, with the rim 60A sealed thereto, may be lifted out.

Preferably, the rim 60A is molded from a thermoplastic material such as RYTON, but one may choose to employ a thermosetting or epoxy material. The injection molding to create the rim 60A is basically like that described above with reference to FIG. 7 except that the bottom wall insert 48 is not present in the mold.

As a preferred detail, the dies of FIG. 12 are shaped to leave inner corner recesses 84 at the upper and lower mouths of the rim.

After the rim 60A has been so formed on the lead frame, a bottom wall insert 78' is associated with the lower mouth of the rim 60A. As illustrated by FIG. 13, the subassembly of frame 25 and rim 60A is turned up-side-down so that the "upper" end of the rim fits down over a suitably shaped support platen 85. The platen gives good support for the interior lead fingers 26 and the platform 32. Then, the bottom wall insert 78' is located in abutting relation to the underside of the lead fingers and with its edge portions in proximity to, and preferably in contact with, the lower edge portions of the rim 60A. Specifically, the insert 78' is fitted into the rim 60A such that the surface of the recess 78a bears against the platform 32 and the "upper" surface of the insert bears against the lead fingers 26. In the preferred configuration, the flange 78b on the insert fits snugly into the adjacent recess 84 of the rim.

Next, a seal is created between the edges of the insert and the rim 60A. This may be accomplished by any of a variety of suitable procedures. In one simple technique, an epoxy glue may be interposed between insert 78' and the rim 60A. If the rim 60A, or the edges of the insert 78', or both, are formed of a thermoplastic material, then heat may be applied to partially melt and thereby fuse the two components in sealed relation. FIG. 13 shows a known and satisfactory technique for this; the tool or horn 86 of an ultrasonic welding apparatus is brought to bear on the insert 78', and the high frequency vibration energy at the contact regions (e.g., at flange 78b and recess 84) generates heat which fuses the insert to the rim thereby to create the hermetic seal.

When the operation depicted by FIG. 13 is complete, the structurally combined lead frame 25, rim 60A, and insert 78' are lifted from the platen 85. The subassembly is a plastic "box" open at the top with the central region of the lead frame backed up and supported by the insert 78' as well as the web of plastic material which is now disposed between the adjacent lead fingers. Next, the IC chip 35 and the wire connectors 36 are installed on the upper surfaces of the platform and the lead fingers. This is carried out by essentially the same procedure described above with reference to FIG. 8, and thus it need not be separately illustrated or treated in further detail for the second embodiment. The subassembly may be supported in a platen 61 while the chip 35 is fixed by an adhesive in place on the pad 32 and while the wires 36 are bonded between the chip terminals and the lead finger tips.

With the chip and wires installed, the top wall cap 78" is associated with or in the upper mouth of the rim 60A (conveniently while the subassembly is still supported on the platen 61). As illustrated in FIG. 14, the top wall cap 78" is placed downwardly on and into the upper mouth of the rim 60A. Although it is not essential, the cap 78" in the present illustration bears down against the lead fingers 26 in a region outwardly from the chip 35 and the wires 36. The recess 78a in the cap 78" leaves the cap free of contact with the chip 35 and the wires 36. Specifically in the example shown as a preferred configuration, the flange 78b on the cap 78" fits snugly into the adjacent recess 84 of the rim.

Next, a seal is created between the edges of the cap 78" and the rim 60A. This may be accomplished in any of a variety of suitable procedures, for example, by application of an epoxy glue before the cap is located in place. If the rim 60A, or the edges of the cap 78", or both, are formed of a thermoplastic material, heat may be applied to partially melt and thereby fuse the latter material to create the desired hermetic seal. FIG. 14 shows a known and satisfactory technique for generating such heat at the contacting surfaces of the rim and the cap. A tool or horn 86 of an ultrasonic welding appliance is brought to bear on the cap 78" and the high frequency vibration energy at the contacting regions generates heat which fuses the cap edges to the rim 60A, thereby to create the hermetic seal as well as a semi-homogeneous and mechanically strong structure.

When the ultrasonic fusion seal has been completed as shown in FIG. 14, the product has reached the stage depicted and described above with reference to FIG. 15. The trimming of the exterior portions of the lead frame, and the bending of the leads 22, are carried out in the same fashion, thereby to arrive at an end product which appears like that in FIG. 1. The fully completed and hermetically sealed plastic housing 21 (constituted by the rim 60A, the insert 78' and the cap 78") surrounds the IC chip 35 and its fine wire connectors 36, external electrical connections being available to the terminals of the chip via the leads 22 which extend in sealed relation through the rim. In the process of making this fully sealed housing, with the IC chip therein, the chip itself and its fine wire connections have not been subjected to the possibility of physical damage by the flowage of plastic material thereover. Thus, the second embodiment of the method, and the resulting product, are similar in nature to the first embodiment; but specifically different steps are involved in the second embodiment, mainly in that the bottom wall insert is not sealed to the rim simultaneously or concurrently with the injection molding which creates the rim.

AN OVERVIEW OF THE PRESENT INVENTION

Applicant is aware that so-called "MIL SPEC" integrated chip packages have been and are formed with housings of ceramic or glass-like silicon base materials. To meet the rigid requirements of military equipment specifications, the "MIL SPEC" integrated circuit packages cannot be made of commercially available thermosetting or thermoplastic materials accommodated by injection molding procedures. In making "MIL SPEC" packages, the lead frame fingers are laid on the upper surface of a ceramic substrate shaped generally like an open-ended box. The chip having been fixed to the bottom of the box by an organic adhesive capable of withstanding high temperatures and the wire connectors having been installed between the lead finger tips and the chip terminals, an inverted box closure is mated to the first box edges above and in contact with the lead fingers. Glass frit disposed above, below and around the lead fingers, and between the edges of the substrate and the top closure, is then "fired" at a temperature of about 450° C. to melt the glass and form a solid glass seal through which the lead fingers project. Such "MIL SPEC" integrated chip packages are rated for operation at much higher temperatures than the so-called "commercial grade" packages, and their hermetic integrity is greater in the face of environmental temperature changes, pressure changes, and vibration. But such high quality comes at the penalty of greatly higher cost, and molded plastic material cannot presently be used for all or part of the housing.

Encapsulation (as described with reference to FIG. 4) has been the most widespread technique for making commercial grade IC packages. Although it is perhaps not the exclusive technique, manufacturing operations of encapsulation are less complex and expensive, and the plastic material is much less expensive than ceramic components and glass frit seals fused at very high temperatures. As noted briefly above, however, commercial grade integrated circuit packages have been burdened with rejects that result from physical damage (sometimes called "lead wash") during the formation of the housing, or from thermal shock, with most rejects not only spoiling the costly chip itself but also the investment in the previous work of installing the fine wire connectors.

The present invention, it will now be seen, reduces rejects and spoilage incident to formation of an hermetically sealed housing containing an IC chip to arrive at a Type I integrated chip package. The package of the present invention includes a sealed housing constituted at least in part by a molded plastic rim forming the side walls of the housing. It wholly eliminates the possibility of "lead wash". Moreover, it avoids the possibility of thermal shock to the IC chip and the fine wire connections because no hot material comes into contact with them after they have been installed in the "bottom" of the "box" and before the lid or cap is located and sealed in place. While one might seek to form a solidified plastic "box" open at the top, then lay the lead frame thereon, thereafter install the chip and wires, and then sealingly close the top of the box while creating a seal around the lead fingers (as suggested by known manufacturing techniques for "MIL SPEC" packages), this is in fact impossible to accomplish with plastic materials in an economically viable way of manufacturing Type I IC packages. If the "MIL SPEC" procedure were employed to make Type I packages, the seal to the lead frame would be formed after the chip and wires were in place; thus, plastic injected between the lower part of the box and the box top to create a seal to the lead frame would inevitably flow into the space containing the chip and the wires. On the other hand, if an open box, including the bottom wall, were formed wholly by an injection molding operation to capture the lead frame (and without employing a solid insert as here described), the injected plastic would inevitably creep up and onto the upper surfaces of the lead fingers, and such solidified plastic on those surfaces would make it virtually impossible subsequently to install the wire connectors with the necessary electrical connections.

In review, the method of the present invention includes the following steps:

(a) a solid bottom wall insert (48 or 78') is preformed;

(b) a solid top wall cap (50 or 78") is preformed;

(c) a rim (60 or 60A) is formed on and sealed to a lead frame, by injection molding of a suitable plastic material, to surround the inner portions of the lead fingers and the central region of the lead frame;

(d) the chip 35 and the wire connectors 36 are installed in association with the lead frame, access to the latter being gained through the open, upper mouth of the rim;

(e) the solid bottom wall insert is disposed in general registry with the lower mouth of the rim (or in the region where the lower mouth will be formed);

(f) the solid top cap is disposed in general registry with the upper mouth of the rim, preferably free of contact with the chip and wires;

(g) a seal is created between the solid bottom insert and the rim; and (h) a seal is created between the top cap and the rim.

The sequence of those steps is non-critical; they may be executed in any chosen order—except for one crucial relationship which results in achievement of the main advantage of the invention. This is: Step (d) is carried out subsequent to step (c). When that requirement is observed, then no hot, flowable plastic flows over or comes into contact with the chip, the fine wires, or the electrical connections at the ends of those wires.

Of course, steps (a) and (b) will necessarily be executed prior to steps (e) and (f), respectively. Likewise, steps (g) and (h) will necessarily be performed subsequent to steps (e) and (f), respectively. But step (g) may be carried out either subsequent to step (c)—as in FIG. 13, for example—or concurrently with step (c) as in FIG. 7 for example.

If the central platform 32 is included as a part of the lead frame in the latter's central region 28 (and this is optional), then step (d) may optionally be carried out either prior to step (e) with the aid of a platen or other support, or subsequent to step (e)—the latter being preferred. On the other hand, if the platform 32 is not included in the central region 28 of the lead frame, step (d) should (as a matter of practical preference) be carried out subsequent to step (e) by mounting the chip 35 with a suitable adhesive directly on the upper surface of the bottom wall insert.

As noted above, the bottom insert 48 and the top cap (50 or 78") need not be made, wholly or at their edge portions, of a solidified plastic material (although that is preferred for the reasons given above). They may be made of glass, metal or a combination of those materials.

Also, as previously noted, the two hermetic seals, between the insert and the rim and between the top cap and the rim, may be created in any satisfactory fashion—even by an epoxy glue curable at room temperature. For economy and seal integrity, these seals preferably are created by heat fusion of thermoplastic material which is present in the rim and/or the edge portions of the bottom insert and the top cap.

Although the method of the present invention, and the articles of manufacture which result from that method, have been described with reference to IC chips connected to lead frame fingers within a sealed housing, it will be apparent that the invention in its generic aspects will find applicability in forming sealed housings containing other specific types of objects. In a generic sense, the chip 35 and/or its wire connectors 36 constitute a "delicate structure" which is subject to damage due to flowage (e.g., so-called "lead wash"), thermal shock, or chemical reaction when contacted by in-flowing injected plastic material. Similarly, the lead frame 25 (which is a thin, planar and sheet-like object with portions removed to define the fingers 26) constitutes a "connection sheet" with which the "delicate structure" is to be associated and connected. Accordingly, those two terms will be used as generic names in some of the appended claims for purposes of breadth.

I claim:

1. The method of sealing a delicate structure, connected to a flexibly deformable connection sheet, within a housing having a side wall rim extending between top and bottom walls, said delicate structure being subject to damage by passage of or contact with flowing plastic material, said method comprising in combination (a) forming a bottom wall insert, (b) forming a top wall cap, (c) associating said connection sheet with a mold cavity while injecting a plastic material in flowable state, and causing said material to solidify, to form said rim which captures and bonds to said connection sheet, (d) locating said bottom wall insert in general proximity to the region to be occupied by the lower edges of the rim, (e) subsequent to said step (d), creating a seal between the edges of said bottom wall insert and said rim, (f) subsequent to said step (c), installing said delicate structure and making connections between it and the exposed upper surfaces of said sheet, (g) subsequent to said step (f), locating said top wall cap above the delicate structure and in proximity to the upper edges of said rim, and (h) subsequent to said step (g), creating a seal between the edges of said cap and said rim, said step (d)

being performed prior to step (c) and said steps (c) and (e) being performed concurrently.

2. The method set forth in claim 1 wherein said step (d) further includes bringing the bottom wall insert into underlying abutment with said connection sheet, and said steps (c) and (e) are carried out concurrently by associating said connection sheet and the abutting insert within a mold cavity which defines said rim in contact with the edges of the insert while injecting a plastic material in flowable state, and causing said material to solidify in intimate, sealing contact with the edges of said insert.

3. The method set forth in claim 2 further characterized in that said step (a) is carried out to form at least the edge portions of said bottom wall insert of a solidified thermoplastic material, and said steps (c) and (e) are both accomplished concurrently by injecting a thermoplastic material at elevated temperature and then permitting it to cool, whereby the edges of said insert are at least slightly melted by heat from the injected material and a fusion seal is formed between the insert edges and the resulting rim.

4. The method of sealing an integrated circuit chip within a housing and with externally extending leads for electrical connections, said method comprising, in combination,
 (a) forming a bottom wall insert,
 (b) forming a top wall cap,
 (c) disposing said insert in underlying abutment with the central region of a lead frame sheet of conductive material, said lead frame having spaced lead fingers extending inwardly with their tips in proximity to a central region,
 (d) disposing the abutting lead frame and insert in a mold cavity while injecting plastic material in a flowable state, and causing said material to solidify, to form a rim which captures and sealingly bonds to said lead frame, said rim surrounding and being spaced from the inner tips of said lead fingers, and said rim at the time of its formation being bonded and sealed to the edges of said bottom wall insert,
 (e) installing the integrated circuit chip in the central region of said lead frame, and making conductive wire connections from terminals on the chip to the inner tips of respective lead fingers, and
 (f) disposing said top cap in or at the upper region of said rim and creating a seal between the two.

5. The method set forth in claim 4 further characterized in that said step (a) is carried out to form at least the edge portions of said bottom wall insert of solidified thermoplastic material, and said step (d) is carried out by injecting a thermoplastic material at elevated temperature and then permitting it to cool, whereby said rim at the time of its formation becomes bonded and sealed by fusion to the edges of said insert.

6. The method of sealing an integrated circuit chip within a housing and with externally extending leads for electrical connections, said method comprising, in combination,
 (a) forming a bottom wall insert,
 (b) forming a top wall cap of a predetermined peripheral configuration,
 (c) disposing said insert in underlying abutment with the central region of a lead frame sheet of conductive material, said lead frame having spaced lead fingers extending inwardly with tips bordering a central region,
 (d) disposing the abutting lead frame and said insert in a first mold cavity while injecting plastic material in a flowable state, and causing said material to solidify, to form a rim which captures and bonds to said lead frame and intimately bonds to the edges of said insert, the resulting structure being a plastic box open only at its top through which the central region of said lead frame and the inner ends of the lead fingers are accessible, with the lead fingers backed-up by the insert and extending in sealed relation outwardly through the rim,
 (e) installing the integrated circuit chip in the central region of said lead frame and making conductive wire connections from terminals on the chip to the inner tips of respective lead fingers,
 (f) locating said top wall cap above the now-installed chip and wires, the predetermined peripheral configuration of said cap resulting in its edges being in proximity to the upper edge of said rim, and
 (g) disposing the thus-located assembly in a second mold cavity while injecting plastic material in a flowable state, and causing said material to solidify and form a bonded bridge joining the edges of the cap and rim.

7. The method set forth in claim 6 further characterized in that said steps (d) and (g) are carried out by injecting a thermoplastic material at elevated temperature, whereby a fusion seal is formed between said rim and bridge during said step (g).

8. The method set forth in claim 6 further characterized in that said steps (a) and (b) are carried out to form at least the edge portions of said bottom wall insert and said top wall cap of solidified thermoplastic material, and the injecting of said steps (d) and (g) is carried out by injecting a thermoplastic material at elevated temperature, whereby said bottom insert and said rim are sealingly joined by fusion, and said top cap and the rim are each sealingly joined to said bridge by fusion.

9. The method set forth in claim 6 further characterized in that said step (b) is carried out to form the top wall cap in the shape of a plug which fits into the upper mouth formed by said rim, said plug—after said step (f) is completed—bearing against the lead frame in a region adjacent to the rim but spaced from and surrounding said central region, and said plug being free of contact with said chip and said wires.

10. The method of sealing a delicate structure, connected to a flexibly deformable connection sheet, within a housing having a side wall rim extending between top and bottom walls, said delicate structure being subject to damage by passage of or contact with flowing plastic material, said method comprising in combination
 (a) forming a bottom wall insert,
 (b) forming a top wall cap,
 (c) associating said connection sheet with a mold cavity while injecting a plastic material in flowable state, and causing said material to solidify, to form said rim which captures and bonds to said connection sheet,
 (d) locating said bottom wall insert in general proximity to the region occupied or to be occupied by the lower edges of the rim,
 (e) subsequent to said step (d), creating a seal between the edges of said bottom wall insert and said rim,
 (f) subsequent to said step (c), installing said delicate structure and making connections between it and the exposed upper surface of said sheet, (g) subsequent to said step (f), locating said top wall cap above the delicate structure and in proximity to the upper edges of said rim, and (h) subsequent to said step (g), creating a seal between the edges of said cap and said rim by associating the top cap and the rim within a mold cavity which defines a space bridging the edges of the cap and the rim while injecting a platic material in flowable state, and causing said material to solidify in intimate sealing contact both with the edges of the cap and with the rim.

11. The method set forth in claim 10 further characterized in that said step (b) is carried out to form at least the edge portions of said top wall cap of a solidified thermoplastic material, said step (c) is carried out by injecting a thermoplastic material at elevated temperature and then permitting it to cool, and said step (h') is carried out by injecting a thermoplastic material at elevated temperature and then permitting it to cool, whereby the edges of the cap and the rim are at least slightly melted by heat from the last-mentioned injected material and a fusion seal is created between the edges of the cap and the rim, on the one hand, and the plastic which fills said bridging space, on the other hand.

12. In a method of making an integrated circuit chip assembly which is comprised of an integrated circuit chip connected to lead frame fingers within a sealed housing through which the fingers within a sealed housing through which the fingers extend for external electrical connection, the combination of steps which include (a) pre-forming a bottom wall insert,
(b) placing said insert in underlying relation to the lead frame,
(c) disposing the lead frame and the underlying insert in a mold cavity which extends above and below the lead frame and borders the periphery of the insert, and injecting a plastic material in flowable state into the cavity,
(d) permitting or causing said plastic material to solidify, thereby creating a rim through which the lead frame extends in sealed relation and which at its lower portion has intimate, sealing contact with the edges of the insert,
(e) installing the integrated circuit chip through the open upper mouth of said rim and connecting the chip electrically to the lead frame, and
(f) locating a top wall cap in the upper mouth of said rim and creating a seal between the rim and the edges of the cap.

13. The method defined by claim 12 further characterized in that
said step (a) is carried out to form at least the edge portions of said bottom wall insert of a solidified thermoplastic material,
said step (c) is carried out by injecting a thermoplastic material which is heated and flowable, and
said step (d) is carried out by permitting the injected material is cool,
whereby the edges of the insert are at least slightly melted by heat from the injected material and a fusion seal is automatically formed between the insert edges and the resulting rim.

14. The method defined by claim 12 further characterized in that
said step (f) is carried out by associating the top cap and the upper portion of the rim within a mold cavity which defines a space bridging the edges of the cap and the rim, while injecting a plastic material in flowable state into such cavity, and causing said injected material to solidify in intimate sealing contact both with the edges of the cap and with the rim.

15. The method set out in claim 14 further characterized in that
said top wall cap is pre-formed with at least its edge portions of a solidified thermoplastic material,
said step (c) is carried out by injecting a thermoplastic material at elevated temperature, and
said step (f) is carried out by injecting a thermoplastic material at elevated temperature into said bridging cavity and then permitting it to cool,
whereby the edges of the cap and the rim are at least slightly melted by heat from the last-mentioned injected material and a fusion seal is created between the edges of the cap and the rim, on the one hand, and the plastic which fills said bridging cavity, on the other hand.

* * * * *